United States Patent [19]

Ono et al.

[11] Patent Number: 4,717,880
[45] Date of Patent: Jan. 5, 1988

[54] ESR SPECTROMETER HAVING SPLIT-RING RESONATOR

[75] Inventors: Mitsuhiro Ono; Kokusho Sha; Michiya Suzuki; Tateaki Ogata, all of Yamagata; Ekuo Yoshida, Tokyo, all of Japan

[73] Assignee: JEOL Ltd., Tokyo, Japan

[21] Appl. No.: 893,219

[22] Filed: Aug. 5, 1986

[30] Foreign Application Priority Data

Aug. 23, 1985 [JP] Japan ................. 60-185177
Aug. 23, 1985 [JP] Japan ................. 60-185178
Mar. 10, 1986 [JP] Japan ................. 61-52189
Mar. 10, 1986 [JP] Japan ................. 61-52190

[51] Int. Cl.$^4$ ............................................. G01V 33/24
[52] U.S. Cl. .................................. 324/316; 333/219; 324/318
[58] Field of Search ............ 324/300, 316, 318, 58 C, 324/58.5 C; 313/146, 149; 333/219; 361/287, 292, 298

[56] References Cited

U.S. PATENT DOCUMENTS 2,578,429 12/1951 Karplus ............................ 361/292
4,446,429 5/1984 Froncisz et al. .................. 324/316
4,633,180 12/1986 Biehl et al. ...................... 324/316

OTHER PUBLICATIONS

Radio Shack, 1974-75, Dictionary of Electronics, 1974, pp. 149 & 291.
Split-Ring Resonator for Use in Magnetic Resonance from 200-2000 MHz, by W. N. Hardy et al., *Rev. Sci, Instrum.*, 52(2), Feb. 1981, pp. 213-216.

*Primary Examiner*—Stewart J. Levy
*Assistant Examiner*—Kevin D. O'Shea
*Attorney, Agent, or Firm*—Webb, Burden, Robinson & Webb

[57] ABSTRACT

The prior art split-ring resonator for use in an electron spin resonance (ESR) spectrometer comprises a circular cylinder made from an electrically conductive material and housed in a metallic tube. The cylinder is provided with a split extending axially of the cylinder. A sample to be investigated is inserted into the cylinder in the axial direction. In accordance with the invention, a shielding member which is wider than said slit and made from an electrically conductive material is disposed so as to shield the slit from the inside of the cylinder, whereby the resonance frequency of the resonator is not significantly affected by the presence or absence of the sample or by the amount of the inserted sample.

4 Claims, 25 Drawing Figures

Fig. 7   $\eta$ : RATE OF SAMPLE INSERTION

ESR SPECTROMETER HAVING SPLIT-RING RESONATOR

DESCRIPTION

Background of the Invention

The present invention relates to a split-ring resonator for use in an electron spin resonance (ESR) spectormeter.

Figures 1, 2, 3:
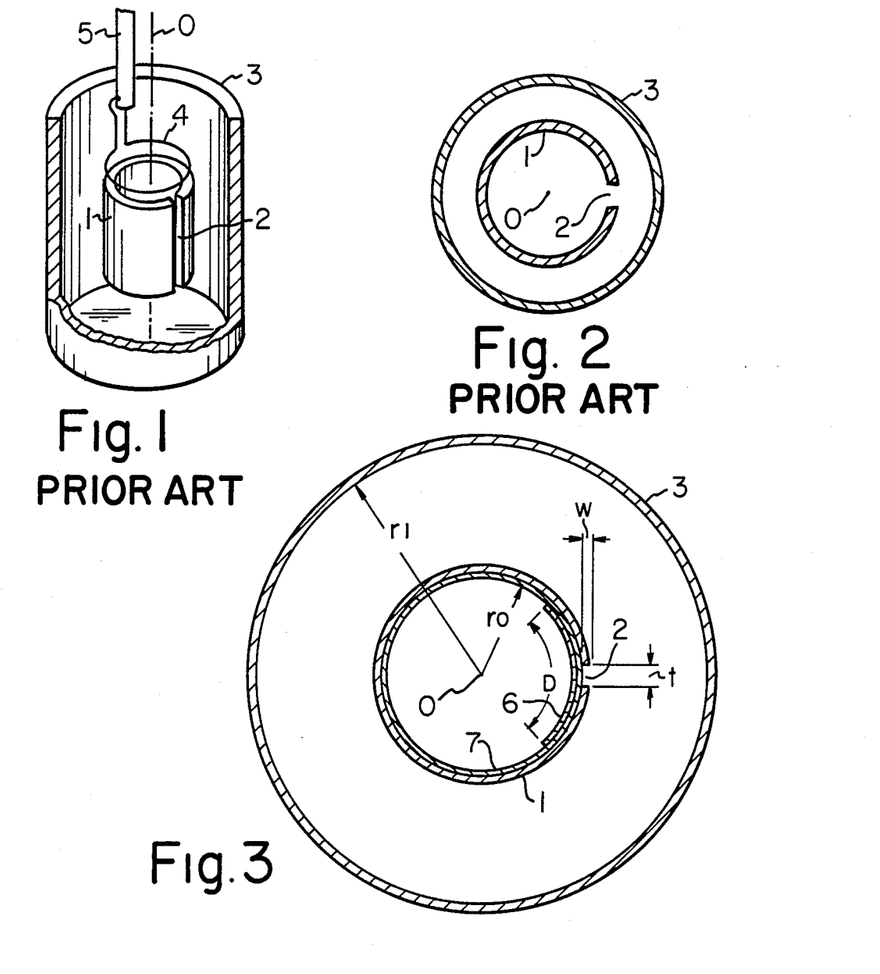
FIG. 1 is a partially cutaway perspective view of the prior art split-ring resonator.
FIG. 2 is a horizontal cross section of the resonator shown in FIG. 1.
FIG. 3 is a cross-sectional view of a split-ring resonator according to the invention.

In recent years, split-ring resonators have attracted attention as the resonators of ESR spectrometers. The prior art split-ring resonator of this kind is shown in FIGS. 1 and 2, where a circular cylinder 1 is made from an electrically conductive matreial. The cylinder 1 is formed with a slit 2, which has a certain width and extends along the central axis of the cylinder. In other words, a plane having the central axis as an element passes through the slit. A sample (not shown) is inserted into the cylinder along the axis. The whole cylinder is shielded by a metallic tube 3. The resonator is connected with an external circuit (not shown) via a loop antenna 4 and coaxial line 5.

The cavity resonator conventionally employed for ESR spectormeters is similar in structure to the resonator shown in FIG. 1 except that the cylinder 1 is omitted. In the conventional cavity resonator of this structure, a sample is placed in the cavity in a position of maximum microwave magnetic field, in order to minimize any interaction and to prevent the Q (quality factor) from being reduced because of dielectric loss. Therefore, only a part of the microwave magnetic field inside the cavity is utilized. On the other hand, the spit-ring resonator shown in FIG. 1 contains all the microwave magnetic field. Hence, the magnetic field is fully utilized. Thus, a good sensitivity can be easily attained. Another advantage of the split-ring resonator arises from the fact that the microwave electric field is concentrated in the slit. Specifically, the water contained in the sample causes less loss of microwave energy. Therefore, the split-ring resonator is preferably used in investigating samples containing much water. The split-ring resonator of this kind is described in U.S. Pat. No. 4,446,429 and Rev. Sci. Instrum. 52(2), Feb. 1981, pp. 213–216. Although the split-ring resonator has excellent features as mentioned above, it has the problem that when a sample is inserted in it, the resonant frequency varies greatly.

SUMMARY OF THE INVENTION

One object of the present invention is to provide a split-ring resonator which is used in an ESR spectrometer and the resonance frequency of which is less affected by the presence or absence of sample or by the amount of the inserted sample than conventional.

Another object of the invention is to provide a split-ring resonator which is used in an ESR spectrometer and the Q of which is less affected by the amount of the sample inserted than conventional.

A further object of the invention is to provide a split-ring resonator which is used in an ESR spectrometer and which makes it possible to correct the change in the resonance frequency by the insertion of sample.

These objects are achieved in accordance with the teachings of the invention by a split-ring resonator comprising a circular cylinder made from and electrically conductive material and having a slit extending along the central axis of the cylinder, the resonator being characterized by the provision of a means for concentrating the electric lines of force produced inside the cylinder in the slit. A typical example of this concentrating means consists of a shielding member that is wider than the slit and made from an electrically conductive material so as to shield the slit from the inside of the cylinder.

Other objects and features of the invention will appear in the course of the description thereof that follows.

DESCRIPTION OF THE PREFERRED EMBODIMENT

In is to be noted that like components are denoted by like reference numerals throughout all the figures, including FIGS. 1 and 2 which have been already used.

Referring to FIG. 3, there is shown a split-ring resonator according to the invention. This resonator is similar to the resonator shown in FIG. 2 except that a shielding member 6 extends on the inner side of the slit 2 so as to shield it from the inside of the cylinder 1, and that shielding member 6 is electrically insulated from the cylinder 1 by a spacer 7. As an example, this spacer is a cylinder of a fluorinated plastic such as polytetrafluoroethylene (e.g. Teflon) on which a foil of copper acting as the shielding member 6 is attached, and the dimensions of the various parts of the resonator shown in FIG. 3 are set as follows: $r_0=13.6$ mm, $r_1=45.0$ mm, $t=1.75$ mm, $w=1.0$ mm, and the axial length (not shown in FIG. 3) of the cylinder 1=28.0 mm. A measurement was made under the condition that the spacer 7 and the shielding member 6 were removed. The resonance frequency of this resonator was observed to be 1.2213 GHz.

Figure 4:
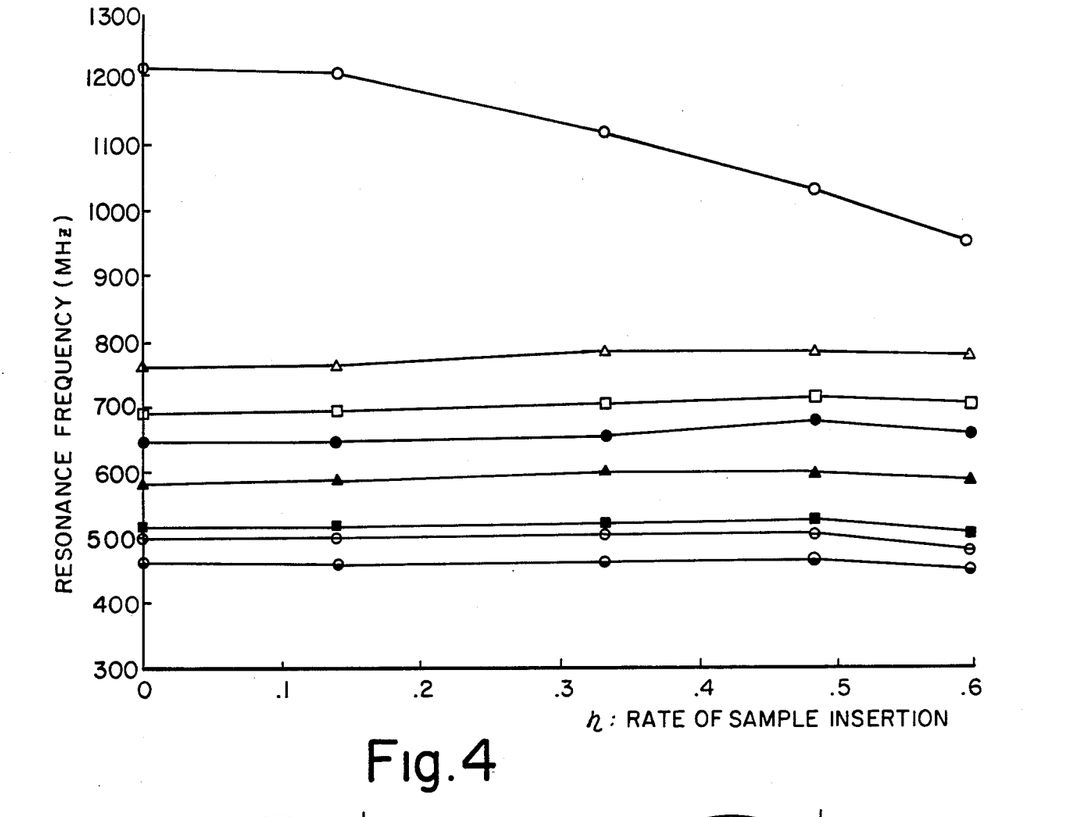
FIG. 4 is a graph in which the resonance frequency of the resonator shown in FIG. 3 is plotted against the amount of sample inserted in the resonator, the frequency having been measured under the conditions in which no shielding member is mounted and in which shielding member is mounted.

Physiological salt solution contained in sample holder was put into the resonator from which the shielding member 6 and the spacer 7 were removed. Then, the amount of the introduced solution and the resonance frequency were measured to find the relationship between them. At this time, a network analyzer was connected between a microwave sweep generator and the resonator. The amount of the solution and the frequency are plotted by marks of small circles ○ in FIG. 4. More specifically, this amount of the solution is given by the rate $\eta$ of insertion of the sample into the resonator, i.e., $\eta=Y/Y_0$, where $Y_0$ is the volume of the cylinder, and Y is the volume of the sample. The plotted marks ○ in FIG. 4 show that as the amount of the inserted sample increased gradually, the resonance frequency gradually decreased from 1.2213 GHz. When sample of $\eta=0.596$ was inserted, the frequency decreased by approximately 0.2753 GHz to 0.9460 GHz.

Figure 5A:
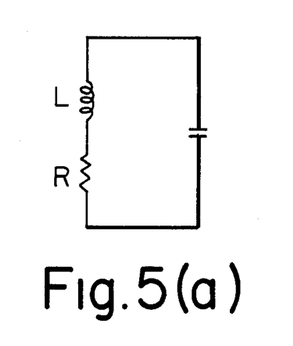
FIGS. 5(a) to (c) show equivalent circuits of split-ring resonators.
Figure 5B:
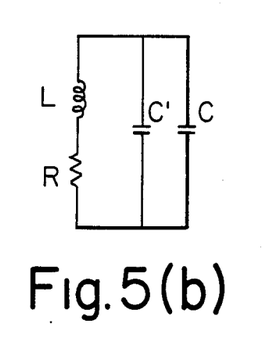
Figure 6A:
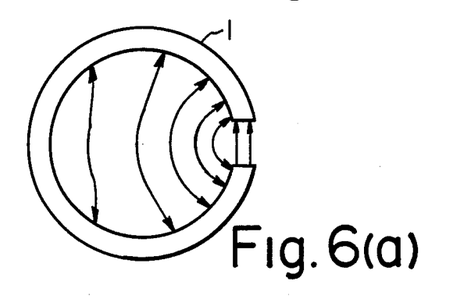
FIGS. 6(a) to (g) show the electric lines of force or the distributions of stray capacitance in various cylinders.
Figure 6B:
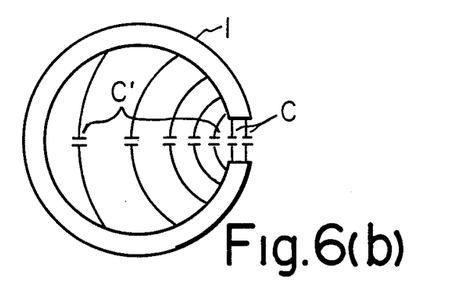
Figure 6C:
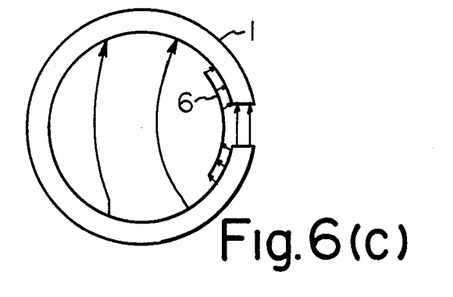
Figure 6D:
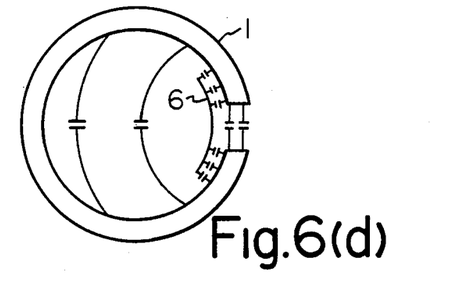

This decrease in the resonance frequency is now described. An equivalent circuit of the split-ring resonator shown in FIG. 3 from which the spacer 7 and the shielding member 6 are removed is shown in FIG. 5(a), where a capacitor of capacitance C and a combination of a coil of inductance L and a resistor of resistance R correspond to the slit 2 and the cylinder 1, respectively. Generally, however, the coil of the RF circuit produces not only an inductance but also a stray capacitance. Therefore, as shown in FIG. 6(a), electric lines of force are produces also from the cylinder of the split-ring resonator. Thus, an equivalent circuit of the resonator in the actual form is represented in FIG. 6(b), where a stray capacitance C' corresponding to the cylinder is connected in parallel with the capacitor C corresponding to the slit. When a sample containing a large amount of water is inserted in this cylinder, the sample increases the stray capacitance, leading to a reduction in the resonance frequency.

Where the shielding member 6 is disposed on the inner side of the slit 2 in accordance with the invention, the produced electric lines of force are concentrated near the slit by the shielding member 6 as shown in FIG. 6(c). For this reason, the capacitors formed on the cylinder are concentrated near the slit, as shown in FIG. 6(d). As a result, when a sample is inserted into the cylinder, the resonator is less affected by the inserted sample. Further, increases in the stray capacitance are suppressed. Consequently, the change in the resonance frequency is suppressed.

In FIG. 4, the marks △, ロ, ●, ▲, ■, ⊖, ◐ show the relation between the resonance frequency and the rate $\eta$ under the condition that the shielding member 6 having width D (FIG. 3) is disposed on the inner circumference of the cylinder 1. Where the marks △, ロ, ●, ▲, ■, ⊖, ◐ correspond to D=23 mm, D=34 mm, D=40 m, D=50 mm, D=59 mm, D=69 mm, D= 78 mm, respectively. The marks plotted in FIG. 4. show that as the rate $\eta$ of sample insertion is varied from 0 to 0.596, the resonance frequencies fluctuate from a maximum decrease of 0.0248 GHz to a maximum increase of 0.0357 GHz. As can be seen from the plotted marks of small circles ○ in FIG. 4, the insertion of $\eta=0.596$ of physiological salt solution caused a change of about 0.2753 GHz. Thus, the shielding member 6 can greatly reduce the change in the resonance frequency caused by the insertion of a sample.

Figure 7:
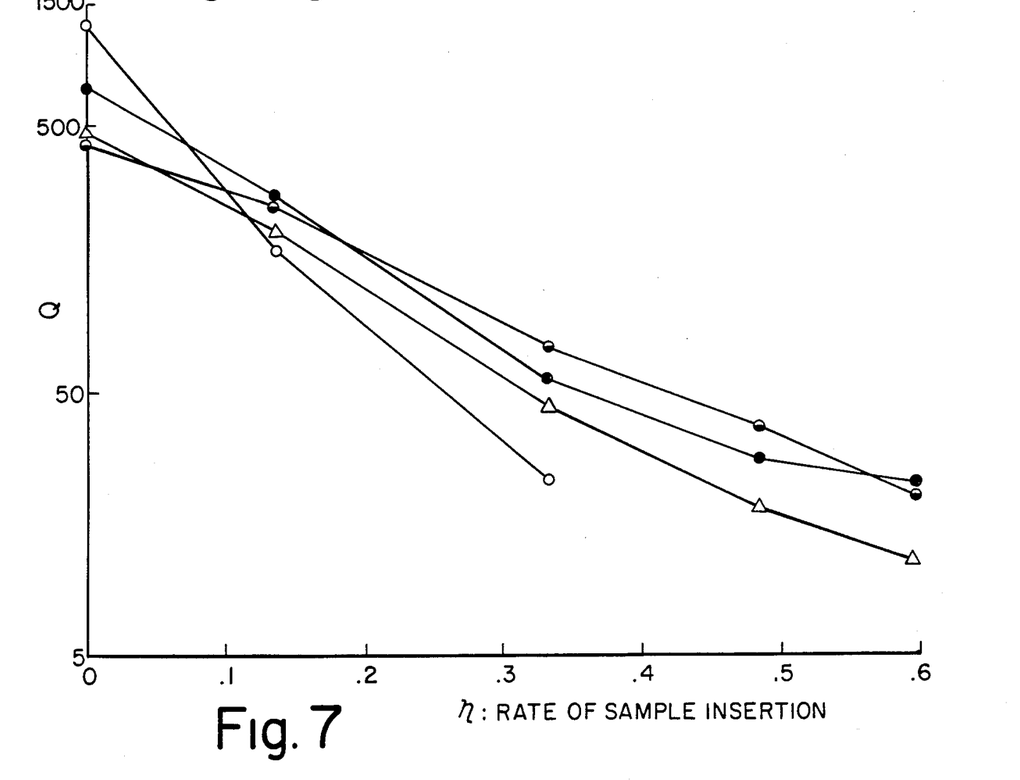
FIG. 7 is a graph in which the Q of the resonator shown in FIG. 3 is plotted against the amount of sample inserted in the resonator, the frequency having been measured under the conditions in which no shielding member is mounted and in which the shielding member is mounted.

In FIG. 7, the relation between the amount of the solution and the Q are plotted by marks of small circles ○ in the condition that the shielding member 6 and the spacer 7 were removed from FIG. 3. As the amount of the inserted sample increased from $\eta=0$ to $\eta=0.334$, the Q gradually decreased from 1230 to 23.3. When the rate is over 0.334, the matching between the resonator and the coaxial line is not obtained, because the voltage standing wave radio (VSWR) is larger than 1.4, and the ESR spectrum cannot be measured.

In FIG. 7, the marks △, ●, ◐ show the relation between the Q and the rate $\eta$ in the condition that the shielding member 6 having width D (FIG. 3) is disposed the inner circumference of the cylinder 1, where the marks △, ●, ◐, correspond to D=23 mm, D=40 mm, D=78 mm, respectively. These marks plotted in FIG. 7 show that as the amount of the inserted sample increased from $\eta=0$ to $\eta=0.596$, the Q is decreased from 708 to 20.6. When the rate $\eta=0.596$, the voltage standing wave ratio VSWR=1.0, so that the matching between the resonator and the coaxial line is easily obtained.

Figures 8, 9, 10, 11:
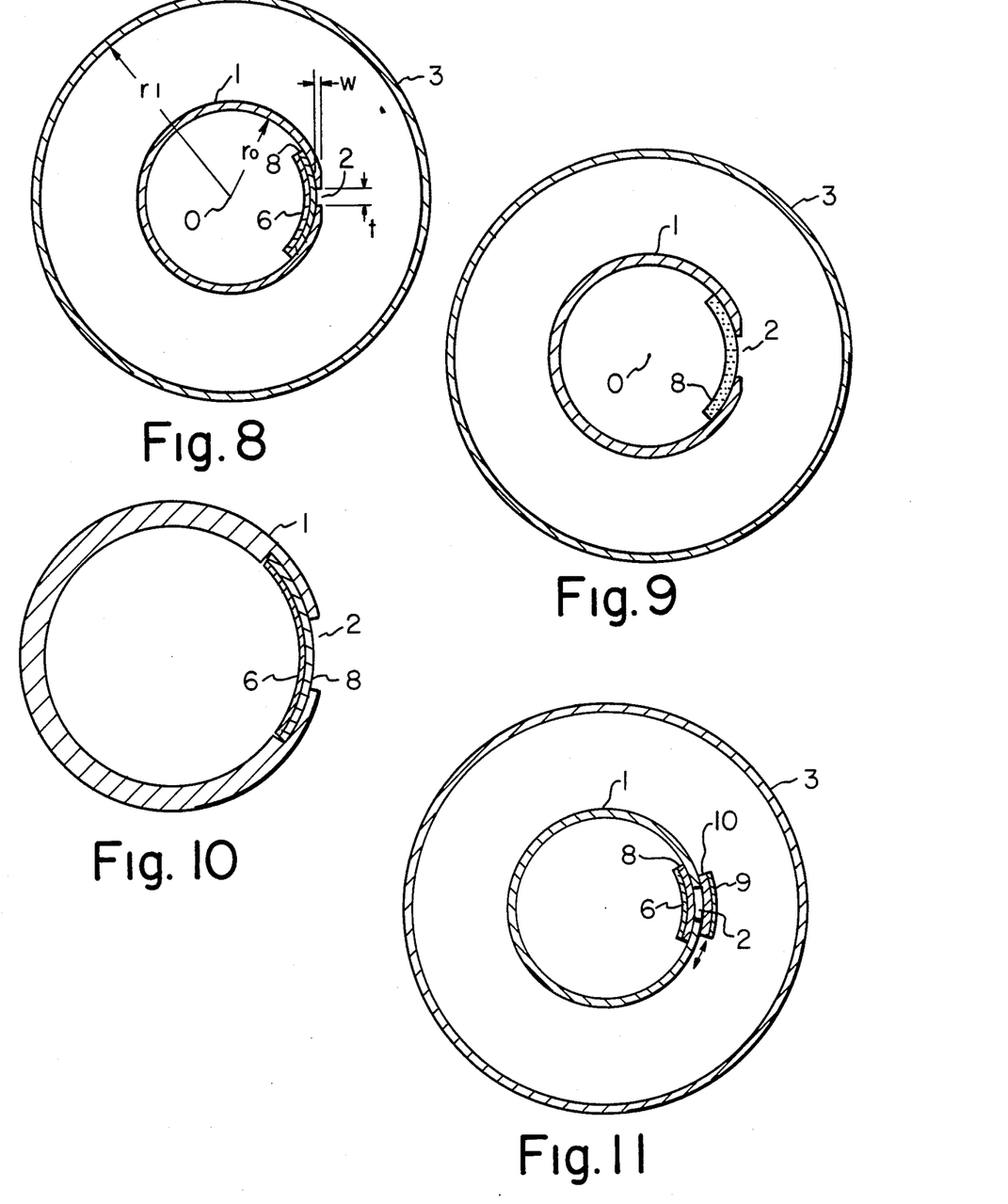
FIG. 8 is a cross-sectional view of another split-ring resonator according to the invention.
FIG. 9 is a cross-sectional view of a further split-ring resonator according to the invention.
FIG. 10 is a cross-sectional view of yet another split-ring resonator comprising a cylinder having no steps.
FIG. 11 is a cross-sectional view of still another split-ring resonator equipped with a means for varying the resonance frequency.

Referring next to FIG. 8, there is shown another split-ring resonator which does not suffer from a large reduction in the Q. This resonator is characterized in that a spacer 8 made from a material of a high dielectric constant is interposed between the shielding member 6 and the cyinder 1. The dimensions fo various parts of the resonator are set as follows: $r_0=14.5$ mm, $r_1=40.0$ mm, $t=5.0$ mm, and $w=5.0$ mm. The axial length 1 of the cylinder 1 is 28.0 mm. The electric lines of force produced in the cylinder 1 are concentrated in the dielectric spacer. Therefore, the electric lines of force passing through the area where a sample is placed are reduced further. Consequently, even if a sample containing a large quantity of water is placed in the resonator, the dielectric loss brought about by the sample is reduced materially. Hence, it is possible that the Q of the resonator decreases slightly.

Figure 6E:
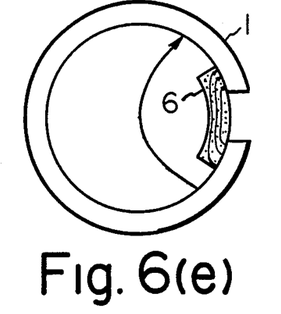
Figure 6F:
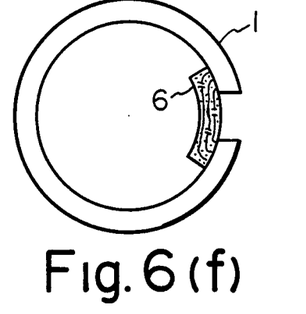

Referring to FIG. 9, there is shown a further split-ring resonator according to the invention. This resonator is similar to the resonator shown in FIG. 8 except that the shielding member 6 is not mounted and that the slit in the cylinder is shielded only by the dielectric spacer 8 which is wider than the slit. As shown in FIG. 6(e), the electric lines of force produced on the inner side of the cylinder of this resonator are concentrated near the inside of the slit. Also, as shown in FIG. 6(f), the capacitors formed on the cylinder are concentrated near the inside of the slit. Although this resonator shown in FIG. 9 yields advantages somewhat poorer than the advantages derived by the resonator shown in FIG. 8, it can accomplish the aforementioned main object of the invention.

In the above examples, the invention is applied to the split-ring resonator having a single slit. The invention is also applicable to a split-ring resonator having two or more slits. In this case, each slit should be shielded by a shielding member. Also, in the above examples, the shielding memer and the dielectric spacer form steps inside the cylinder. Therefore, these steps may hinder inserting a sample into the cylinder or withdrawing it from the cylinder or the sample may come into contact with the steps, damaging the shielding member or the dielectric spacer. To circumvent these undesirable situations, if the cylinder 1 has a sufficient thickness, then the structure shown in FIG. 10 can be adopted. More specifically, grooves are formed in the inner surface of the cylinder 1 to fitly accommodate the shielding member and the dielectric spacer, for removing the steps as mentioned above.

Figure 12:
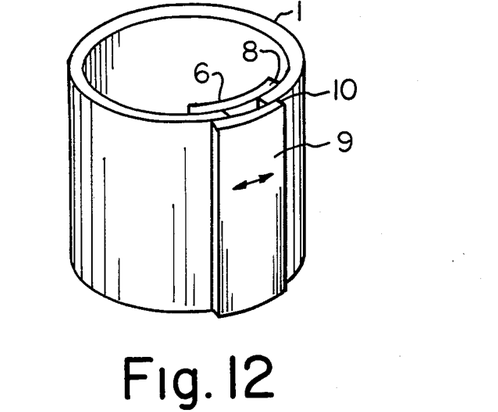
FIGS. 12 and 13 are perspective view of the cylinder 1 of the resonator shown in FIG. 11, but in which shielding members 9 assume different shapes.

Referring next to FIG. 11, there is shown yet another split-ring resonator according to the invention. FIG. 12 is a perspective view of the cylinder of this resonator. In this example, a shielding member 9 made from an electrically conductive material extends on the outer side of the slit 2 to shield it from the outside. A dielectric spacer 10 is interposed between the shielding member 9 and the cylinder 1. The spacer 10 and the shielding member 9 are designed to be able to move together across the slit 2. The spacer 10 is made of a sheet of polytetrafluoroethylene (Teflon), for example. The shielding member 9 attached on the spacer consists of a foil of copper, for example.

Figure 5C:
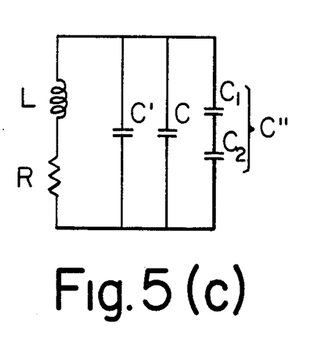
Figure 6G:
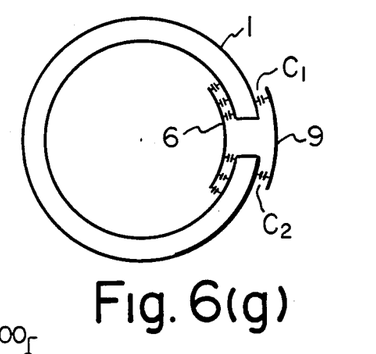
Figure 13:
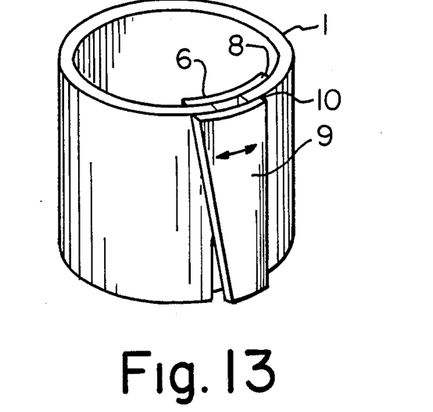

In the example shown in FIG. 12, the shielding member 9 and the dielectric spacer 10 are rectangular in shape. As shown in FIG. 13, they can be shaped into a trapezoidal form, the oblique side of which can move across the slit 2. In this case, capacitors C1 and C2 are formed outside the cylinder as shown in FIG. 6(g). An equivalent circuit of this is shown in FIG. 5(c), where a series combination C" of the capacitors C1 and C2 is added to the outside of the cylinder. When the shielding member 9 and the dielectric spacer 10 are moved across the slit 2, the length of the shielded portion of the slit 2 varies, resulting in changes in the values of the capacitors C1 and C2. Thus, the resonance frequency of the resonator can be varied.

Figure 14A:
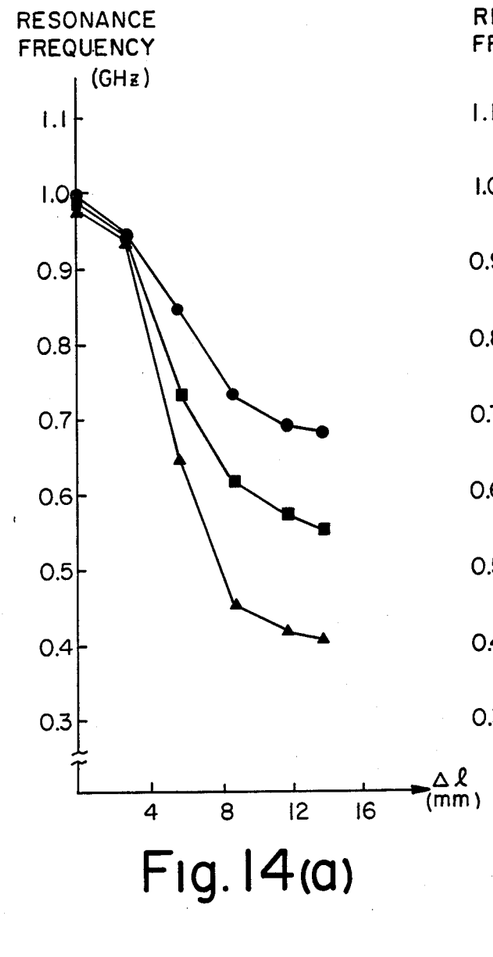
FIGS. 14(a) to 14(b) are graphs in which the resonance frequencies of the resonators shown in FIGS. 15(a) and 15(b) are plotted against the length of the shield portion $\Delta l$.
Figure 14B:
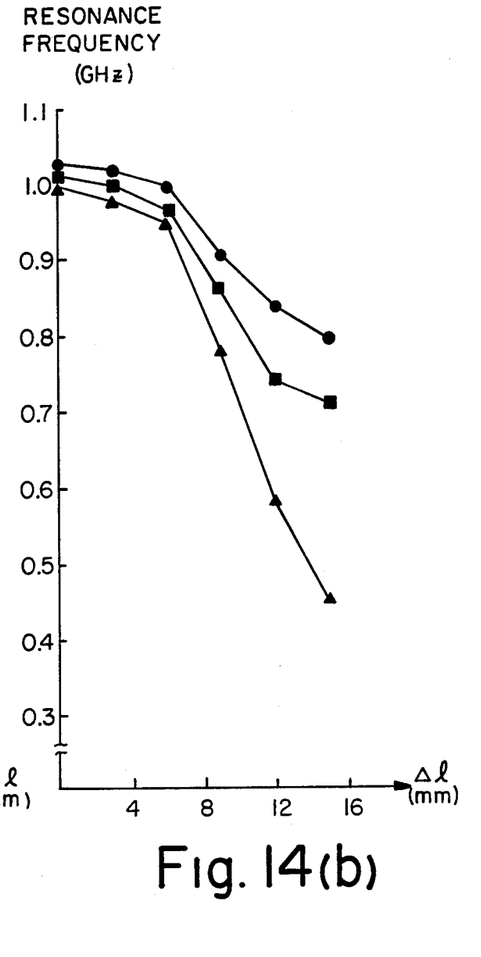
Figure 15A:
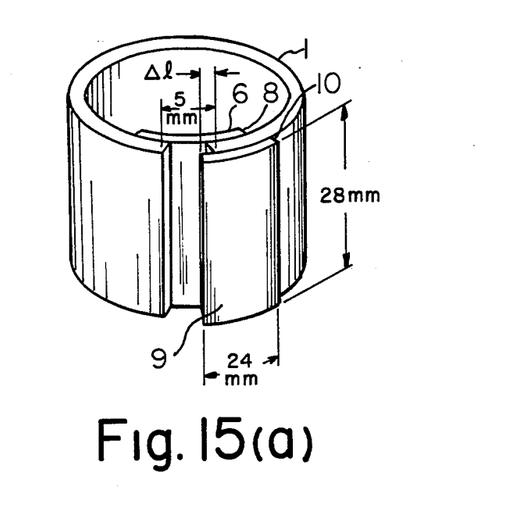
FIGS. 15(a) and 15(b) are views similar to FIGS. 12 and 13, respectively, but in which various dimensions and $\Delta l$ are entered.
Figure 15B:
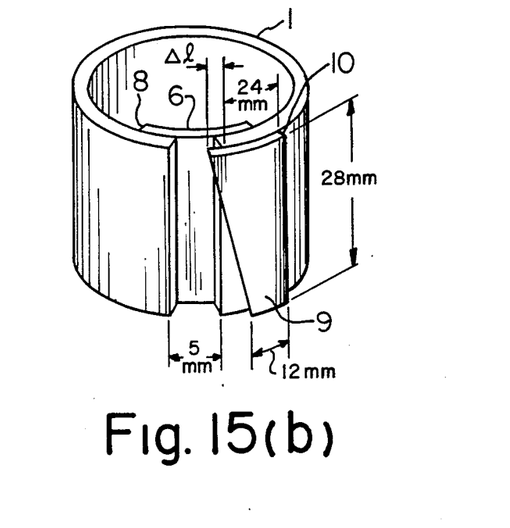

In FIG. 14(a), the resonance frequency of the resonator having dimensions as shown in FIG. 15(a) is plotted against $\Delta l$, i.e., the length of the shielded portion of the slit 2. In FIG. 14(b), the resonance frequency of the resonator having dimensions as shown in FIG. 15(b) is plotted against $\Delta l$. In these graphs, the lines indicated by small black circles ● were obtained where the thickness of the dielectric spacer 10 was 1.0 mm, the lines indicated by small black squares ■ were derived where the thickness was 0.5 mm, and the lines indicated by small triangles ▲ were provided where the thickness was 0.1 mm.

It can be seen from FIGS. 14(a) and 14(b) that as $\Delta l$ increases, the combination C" of the capacitors C1 and C2 increases, thereby lowering the resonance frequency. The lines shown in FIG. 14(b) are gentler (more gradually shaped) than the lines shown in FIG. 14(a). Hence, it can be said that the use of the trapezoidal shielding member makes it easier to finely adjust the resonance frequency than the case where the rectangular shielding member is employed.

We claim:

1. An ESR spectrometer equipped with a split-ring resonator, the said resonator comprising:

a circular cylinder made from an electrically conductive material and provided with a slit that extends along the central axis of the cylinder;

a first shielding member made from an electrically conductive material so as to be wider than the slit, the shielding member shielding the slit from the inside of the cylinder;

a second shielding member made from an electrically conductive material and shielding the slit from the outside of the cylinder;

a dielectric spacer interposed between the second shielding member and the cylinder; and a means for moving the second shielding member and the dielectric spacer across the slit.

2. An ESR spectrometer equipped with a split-ring resonator, the said resonator comprising:

a circular cylinder made from an electrically conductive material and provided with a slit that extends along the central axis of the cylinder;

a dielectric plate which is wider than the slit and shields the slit from the inside of the cylinder;

a shielding member from an elecrically conductive material and shielding the slit from the outside of the cylinder;

a dielectric spacer interposed between the shielding member and the cylinder; and a means for moving the spacer and the shielding member across the slit.

3. An ESR spectrometer having a split-ring resonator, said resonator comprising:

a circular cylinder made from an electrically conductive material and provided with a single slit that extends along the central axis of the cylinder;

a fixed shielding member made from an electrically conductive material so as to be wider than the slit, the shielding member shielding the slit from the inside of the cylinder; and an insulating or dielectric member interposed between the shielding member and the cylinder for supporting the shielding member from the cylider.

4. An ESR spectrometer equipped with a split resonator, the said resonator comprising;

a circular cylinder made from an electrically conductive material and provided with a slit that extends along the central axis of the cylinder;

a first shielding member made from an electrically conductive material so as to be wider than the slit, the shielding member shielding the slit from the inside of the cylinder;

a first insulating or dielectric member interposed between the second shielding member and the cylinder;

a second shielding member made from an electrically conductive material and shielding the slit from the outside of the cylinder;

a second insulating or dielectric member interposed between the second shielding member and the cylinder; and a means for moving the second shielding member and the dielectric spacer across the slit.

* * * * *

UNITED STATES PATENT AND TRADEMARK OFFICE
CERTIFICATE OF CORRECTION

PATENT NO. : 4,717,880

DATED : January 5, 1988

INVENTOR(S) : Mitsuhiro Ono et al.

It is certified that error appears in the above-identified patent and that said Letters Patent is hereby corrected as shown below:

In the Abstract - Line 7 "split" should read --slit--.

Column 1 Lines 9 & 10 "spectormeter" should read --spectrometer--.

Column 1 Line 15 "matreial" should read --material--.

Column 1 Line 24 "spectormeters" should read --spectrometers--.

Column 1 Line 33 "spit" should read --split--.

Column 1 Line 62 Before "sample" insert --a--.

Column 2 Line 45 "view" should read --views--.

Column 2 Line 58 "In" should read --It--.

Column 2 Line 66 After "that" insert --the--.

Column 3 Line 64 "40 m" should read --40mm--.

UNITED STATES PATENT AND TRADEMARK OFFICE
CERTIFICATE OF CORRECTION

PATENT NO. : 4,717,880

DATED : January 5, 1988

INVENTOR(S) : Mitsuhiro Ono et al.

It is certified that error appears in the above-identified patent and that said Letters Patent is hereby corrected as shown below:

Column 4 Line 16 "radio" should read --ratio--.

Column 4 Line 35 "fo" should read --of--.

Column 4 Line 67 "memer" should read --member--.

Signed and Sealed this

Nineteenth Day of July, 1988

Attest:

DONALD J. QUIGG

*Attesting Officer*     Commissioner of Patents and Trademarks